United States Patent
Hunt et al.

(10) Patent No.: US 7,033,637 B1
(45) Date of Patent: Apr. 25, 2006

(54) EPITAXIAL THIN FILMS

(75) Inventors: Andrew Tye Hunt, Atlanta, GA (US); Girish Deshpande, Atlanta, GA (US); Wen-Yi Lin, Ellington, CT (US); Tzyy-Jiuan Jan, Alpharetta, GA (US)

(73) Assignee: MicroCoating Technologies, Inc., Atlanta, GA (US)

( * ) Notice: Subject to any disclaimer, the term of this patent is extended or adjusted under 35 U.S.C. 154(b) by 0 days.

(21) Appl. No.: 09/889,237

(22) PCT Filed: Jan. 12, 2000

(86) PCT No.: PCT/US00/00824

§ 371 (c)(1),
(2), (4) Date: Jul. 10, 2001

(87) PCT Pub. No.: WO00/42621

PCT Pub. Date: Jul. 20, 2000

Related U.S. Application Data

(60) Provisional application No. 60/115,519, filed on Jan. 12, 1999.

(51) Int. Cl.
*B05D 5/12* (2006.01)

(52) U.S. Cl. ............ 427/77; 427/115; 427/126.3; 427/62; 429/30; 429/33; 429/40; 361/505; 29/623.5; 29/729; 29/730; 29/745; 29/746

(58) Field of Classification Search .......... 429/30, 429/33, 40; 427/77, 115, 126.3, 62; 29/623.5, 29/729, 730, 745, 746; 361/505
See application file for complete search history.

(56) References Cited

U.S. PATENT DOCUMENTS

| 5,027,253 | A | * | 6/1991 | Lauffer et al. | 361/321.4 |
|---|---|---|---|---|---|
| 5,741,377 | A | * | 4/1998 | Goyal et al. | 148/512 |
| 5,912,068 | A | * | 6/1999 | Jia | 428/210 |
| 5,919,515 | A | * | 7/1999 | Yano et al. | 427/126.3 |
| 6,060,735 | A | * | 5/2000 | Izuha et al. | 257/295 |
| 6,291,292 | B1 | * | 9/2001 | Yang | 438/241 |
| 6,296,701 | B1 | * | 10/2001 | Christen et al. | 117/94 |
| 6,368,665 | B1 | * | 4/2002 | Hunt et al. | 427/250 |
| 6,458,170 | B1 | * | 10/2002 | Visco et al. | 29/623.4 |
| 6,610,548 | B1 | * | 8/2003 | Ami et al. | 438/3 |

* cited by examiner

*Primary Examiner*—Bruce F. Bell
(74) *Attorney, Agent, or Firm*—Alfred H. Muratori; Wayne E. Nacker

(57) ABSTRACT

Epitatial thin films for use as buffer layers for high temperature superconductors, electrolytes in solid oxide fuel cells (SOFC), gas separation membranes or dielectric material in electronic devices, are disclosed. By using CCVD, CACVD or any other suitable deposition process, epitaxial films having pore-free, ideal grain boundaries, and dense structure can be formed. Several different types of materials are disclosed for use as buffer layers in high temperature superconductors. In addition, the use of epitaxial thin films for electrolytes and electrode formation in SOFCs results in densification for pore-free and ideal gain boundary/interface microstructure. Gas separation membranes for the production of oxygen and hydrogen are also disclosed. These semipermeable membranes are formed by high-quality, dense, gas-tight, pinhole free sub-micro scale layers of mixed-conducting oxides on porous ceramic substrates. Epitaxial thin films as dielectric material in capacitors are also taught herein. Capacitors are utilized according to their capacitance values which are dependent on their physical structure and dielectric permittivity. The epitaxial thin films of the current invention form low-loss dielectric layers with extremely high permittivity. This high permittivity allows for the formation of capacitors that can have their capacitance adjusted by applying a DC bias between their electrodes.

3 Claims, 6 Drawing Sheets

Microstructure of $SrTiO_3$ on Ni

EPITAXIAL THIN FILMS

RELATED CASES

This application claims priority to U.S. Provisional Patent Application Ser. No. 60/115,519, filed Jan. 12, 1999, which is hereby incorporated by reference, in its entirety.

GOVERNMENT CONTRACT

The United States Government has rights in this invention pursuant to Contract No. F33615-98-C-5418 awarded by the United States Department of Defense, and Contract Nos. DE-FG02-97ER82345, ACQ-9-29612-01 and 4500011833 awarded by the United States Department of Energy.

FIELD OF THE INVENTION

The invention relates to epitaxial thin films, and more particularly to epitaxial thin films for use as, inter alia, buffer layers for high temperature superconductors, electrolytes in solid oxide fuel cells (SOFC), gas separation membranes or dielectric material in electronic devices.

BACKGROUND OF THE INVENTION

While the ability to deposit epitaxial coatings on textured substrates has been demonstrated in the past, the methods to produce these coatings have several disadvantages such as being relatively slow as well as requiring expensive vacuum and other extensive equipment. Furthermore, the use of epitaxial coatings has been limited to only a few applications in the past. With the advent of combustion chemical vapor deposition (CCVD), a new, quicker and less expensive method of producing these coatings has been realized. In addition to the cost savings and reduced environmental impact achieved by using the CCVD method, the use of epitaxial coatings has been expanded to several other fields.

The chemical vapor deposition processes that have been so successful include the combustion chemical vapor deposition (CCVD) processes described in U.S. Pat. Nos. 5,652,021; 5,858,465; and 5,863,604, and issued to Hunt et al. These patents, which are hereby incorporated by reference, disclose methods and apparatus for CCVD of films and coatings wherein a reagent and a carrier medium are mixed together to form a reagent mixture. The mixture is then ignited to create a flame or the mixture is fed to a plasma torch The energy of the flame or torch vaporizes the reagent mixture and heats the substrate as well. These CCVD techniques have enabled a broad range of new applications and provided new types of coatings, with novel compositions and improved properties. In addition to these three patents, U.S. Pat. No. 5,997,956, also issued to Hunt et al. describes a further method of CVD involving the use of a thermal spray with near supercritical and supercritical fluid solutions. The coating processes disclosed in this patent are also useful for forming the epitaxial coatings of the present invention, and this patent is incorporated by reference as well.

U.S. Pat. Nos. 5,739,086, issued on Apr. 14, 1998 and 5,741,377 issued on Apr. 21, 1998, both to Goyal et al teach textured articles having a rolled and annealed, biaxially textured metal substrate and an epitaxial coating deposited thereon. The articles are manufactured by rolling and annealing a metal base preform to create a biaxially textured substrate with a face-centered cubic, body-centered cubic or hexagonal closed-packed crystalline structure. Onto the surface of the substrate, an epitaxial layer is deposited to form a biaxially textured laminate. A buffer layer in the form of an epitaxial barrier layer may first be deposited, followed by an epitaxial superconducting layer deposited thereon. A pulsed laser technique, as well as several other techniques may be used to deposit the superconducting and buffer layers.

U.S. Pat. No. 5,523,587 issued on Jun. 4, 1996 to Kwo is drawn toward a method for low temperature growth of epitaxial silicon, and devices produced using this method. The thin layer of epitaxial silicon is grown at temperatures at or below 300° C. by first providing a substrate, forming a dielectric buffer layer and then growing the epitaxial silicon on the buffer layer. A directed ion beam bombards the buffer layer while it is being deposited to provide the desired orientation. The low temperatures used in this deposition process allow for the use of light-weight substances such as glass coated plastics to reduce the weight of displays in hand held and lap-top electronic equipment. These deposition methods, however, require vacuum and other limiting deposition parameters.

U.S. Pat. No. 5,968,877, issued on Oct. 19, 1999 to Budai et al. discloses high $T_c$ YBCO superconductor deposited on a biaxially textured Ni substrate. One or more epitaxial buffer layers are deposited on the Ni substrate prior to the deposition of the c-axis oriented YBCO top layer. The epitaxial buffer layers include $CeO_2$, yttria-stabilized $ZrO_2$ and palladium, while the superconducting layer is $YBa_2Cu_3O_{7-\delta}$. The buffer layers are deposited by pulsed-laser, electron beam evaporation, or sputtering methods.

International Patent Application, Publication No. WO 99/15333, published on Apr. 1, 1999 to Fritzemeier et al. is drawn to superconducting articles with epitaxial layers. The articles are produced in a partial vacuum environment using a gas phase method. The epitaxial or buffer layers may include $CeO_2$, yttria-stabilized $ZrO_2$, $LaAlO_3$, $SrTiO_3$, $LaNiO_3$, $LaCuO_3$, $SrRuO_3$, $CaRuO_3$, $NdGaO_3$ and $NdAlO_3$. By using the gas phase method, the epitaxial buffer layers are formed with a surface having a pore density of less than about 500 pores per $mm^2$.

U.S. Pat. No. 5,741,406, issued on Apr. 21, 1998 to Barnett et al. discloses solid oxide fuel cells having dense yttria-stabilized zirconia (YSZ) electrolyte films and a method of depositing these electrolyte films. The YSZ electrolyte thin films are deposited on a lanthanum strontium manganite (LSM) substrate using an ion-assisted deposition technique such as sputtering. By applying a DC bias voltage to the LSM substrate, ion bombardment of the YSZ film is provided during deposition. The ion bombardment leads to removal of material from protrusions, re-deposition into pores and a more planar film surface.

None of the above references and patents, taken either singly or in combination, is seen to provide an epitaxial thin film, suitable for use as a buffer layer in applications requiring, inter alai, low-loss dielectric substrates with high permittivity.

SUMMARY OF THE INVENTION

The developed CCVD processes described herein have proved advantageous for forming many types of thin films, thick films and other coatings. When used to deposit epitaxial films on lattice matching substrates, the CCVD processes produce very dense, and in some cases, single crystal coatings. These epitaxial coatings are not only useful for producing buffer layers in the field of high temperature superconductors, but can also provide superior coatings in several other fields such as solid oxide fuel cells (SOFC), gas separation systems and microelectronics. Several different CCVD processes have been developed as disclosed in the above-identified U.S. Pat. Nos. 5,652,021; 5,858,465; 5,863,604, and 5,997,956, the specifications of which are hereby incorporated by reference in their entirety. It should be noted that one or more of these CCVD processes may be used to produce the epitaxial coatings of the present invention, depending on the requirements of the application. These requirements include, but are not limited to, speed of deposition, temperature limitations and oxidation reduction or enhancement.

To produce some of the various epitaxial coatings of the present invention, a rolled, textured nickel substrate is coated with the desired material using CCVD. Although other materials with a similar lattice parameter may be used depending on the thin film, Nickel is a preferred material. Nickel is preferred as it is relatively inexpensive, has a high melting temperature, is easily roll textured and can be etched using inexpensive and commercially available materials. In addition, Nickel's lattice parameter facilitate alignment with the lattice of many other materials in the formation of an epitaxial film. Thus Nickel is well suited as a substrate for many applications. However, it will be understood that the methods described herein may employ other substrate materials, depending upon the application, such as where cost is less of an issue, to develop epitaxial films according to the invention. It is also to be noted that the substrate used in the deposition process is not necessarily (and oftentimes is not) a component of the final product. After depositing the epitaxial layer(s) on the textured substrate, the substrate is often etched away, leaving the deposited layer or layers having the preferred epitaxial orientation. Should additional layers be required, they may be deposited prior to or after etching away the textured metal substrate. Of course, for some applications, it may be desirable to leave the original textured substrate as part of the final product. The details of the specific construction and coating process of each epitaxial thin film are further described below, with respect to their particular application.

In the field of high-temperature superconductors, second generation superconducting wire is typically made up of four components, a flexible metal substrate, a buffer layer, a superconducting layer such as $YBa2Cu_3O_{7-x}$ (YBCO), and a final layer in the form of an insulating or conducting layer. Buffer layers are employed to protect the metal substrate from oxidizing during the superconductor application as well as to prevent diffusion of the metal substrate into the superconducting layer. Buffer layers must also impart the desired crystallographic texture to the superconducting layer. High temperature superconductors (HTSC) have enormous potential for electric power applications such as current leads, motors, transmission cables, generators, transformers and current limiters, however, the cost of HTSC wire must be reduced to levels comparable to copper to enable most practical applications. Even the most promising forecasts for mass production cost of state-of-the-art HTSC powder-in-tube wire are well in excess of this target; this wire also suffers from performance limitations. Therefore, processes amenable to scale-up that will facilitate YBCO and associated buffer layer deposition at a low cost with good control of stoichiometry are required for high volume, low cost manufacturing of HTSC wires. The atmospheric pressure combustion chemical vapor deposition (CCVD) process and the controlled atmosphere chemical vapor deposition (CACVD) technique use inexpensive chemical precursors and low cost equipment, and can be configured for continuous, uninterrupted processing of wires and tapes. Prior methods and products cannot compare to the reduced expense and the flexibility of the CCVD methods and high quality epitaxial buffer layers produced thereby.

Since the discovery of high temperature superconductivity by Bednorz and Muller, significant effort has been focused on the manufacturing of flexible, long length conductors with high critical current density for power equipment and other large-scale electrical applications. The above-described YBCO is one such liquid-nitrogen-cooled superconductor with good potential for these applications. However, "weak link" or dissipative behavior at grain boundaries within the current path for YBCO has been this material's major limitation. To overcome this limitation and to obtain high critical current density ($J_c$) values (~$10^5$ to $10^6$ $A/cm^2$ at 77K), it is essential that the crystallographic orientation of the superconducting wire or tape possess a high degree of in-plane and out-of-plane alignment over the entire length of the conductor. Recent innovations in both ion-beam-assisted deposition (IBAD) and in rolling-assisted, biaxially-textured-substrate (RABiTS) technologies have resulted in high $J_c$ values and alleviation of the problems of brittleness and weak links. As these innovations show promise to enable fabrication of long length YBCO wires, both are applicable to the present innovation. Several other methods such as physical vapor deposition techniques, conventional chemical vapor techniques including metal-organic chemical vapor deposition (MOCVD), and the solution techniques, including sol-gel and metal-organic deposition, are available to deposit the above multi-layer oxides. However, all of these methods have expense and scalability limitations. Therefore it is essential to develop inexpensive, easily scalable process for the production of buffer layer oxides with epitaxial or preferred orientation and good stoichiometry control. The previously discussed CCVD processes are capable of doing this.

One type of epitaxial coating of the present invention is the use of selected perovskite oxides, such as $SrTiO_3$, $LaAlO_3$, and $SrLaAlO_4$, as buffer layers for these high temperature superconductors. At this time, it is understood that, selected perovskite oxides such as $SrTiO_3$, $LaAlO_3$, and $SrLaAlO_4$, have not been deposited epitaxially onto textured metal substrates with the entire film exhibiting the desired cube orientation. Deposition conditions and results described herein include results for the CCVD deposition of $SrTiO_3$ on Ni. Conditions for the CCVD deposition of $SrTiO_3$ on other textured metal substrates and $LaAlO_3$ and $SrLaAlO_4$ on Ni and other textured metal substrates would be understood to be similar.

Another type of epitaxial coating described herein involves electrolytes and electrodes for use in solid oxide fuel cells (SOFC). Fuel cells are a fundamentally novel way of generating electrical power from a variety of fuels. It has long been recognized that the successful development and commercialization of fuel cells will offer significant environmental advantage and greatly reduce global pollution. The key advantage of a fuel cell is the high-energy conversion efficiency. Without the intermediate thermal energy, the fuel cell directly converts the electrochemical energy to electrical energy. Other advantages include simpler construction, high efficiency at part load, potential for co-generation, and much lower production pollutants. Currently, the commercial market for fuel cells is limited to spacecraft and other specialty uses, due to the expense of the required chemical precursors and deposition equipment. A fabrication process to deposit low-cost and high quality SOFC thin films without complex post-deposition treatment/sintering is essential for the widespread commercialization of fuel cells. Furthermore, for widespread use, the performance/efficiency of SOFCs must be improved. The present invention provides epitaxial and in some cases single crystal thin films, resulting in the microstructures needed in both the electrolytes and electrodes for improving SOFC performance. In addition, with its open-atmosphere capabilities, the CCVD process enables continuous depositions of these layers with at least 50% capital cost reduction and with 75% in operational costs compared with the other CVD processes, and hence offers significant commercial advantages for the SOFC industry.

Current processes for fabricating oxide electrolytes are limited by the availability of desired powder stoichiometry and characteristics, the film thickness (a result of both raw material availability and process limitation), and the densification for pore-free and ideal grain boundary/interface microstructure. These limitations thus hinder the development and possible improvements of SOFC performance and efficiency. Recently, it has been shown that by fully densifying and greatly reducing the YSZ electrolyte thickness to 4–5μm, the power density of YSZ-based fuel cell can be increased to 1.6 W/cm². This indicates that a technique to fabricate an epitaxial electrolyte layer results in a very thin and fully dense electrolyte layer without relying on the availability of raw materials greatly improves the possibility of the commercialization of SOFCs.

The CCVD processes produce dense and epitaxial electrolyte thin films, porous and adherent electrodes, and may be combined with other coating techniques to construct a superior, solid oxide fuel cell with reduced manufacturing time and costs. By operating in the open atmosphere with inexpensive precursors, CCVD provides continuous coating of epitaxial electrolyte layers, which will increase the ionic conductivity at lower temperatures. The CCVD-based process may also provide for better fuel cell performance by minimizing grain boundary/interface resistance and reducing polarizations. In addition, the CCVD system capitalization requirement is reduced at least ten times compared to a vacuum-based system, and the throughput is far greater than with other technologies. The CCVD process generally uses solutions with all the necessary elemental constituents dissolved in a solvent that also acts as the combustible fuel. The ease of controlling and changing dopants and stoichiometries enables the deposition of multi-layered and multi-compound films in one process, which further increases throughput and reduces production costs. Depositions can be performed at atmospheric pressure and temperature in an exhaust hood, a clean room or outdoors.

Gas separation membranes in accordance with the present invention can also be formed. One application of gas separation membranes is in the production of oxygen. Mixed-conducting oxide membranes could produce oxygen with lower costs then the present commercial means of oxygen production, namely cryogenics, pressure swing adsorption (PSA) and polymeric membranes. Developing these oxygen semipermeable membranes requires the fabrication of a hybrid membrane comprising a thin film of mixed-conducting oxides supported on a porous substrate, preferably of the same material. CCVD can be used to deposit high-quality, dense, gas-tight, pinhole free sub-micron scale layers of mixed-conducting oxides onto porous ceramic substrates. Such hybrid membranes will offer both high permselectivity and high transport rates for oxygen, thereby enabling its widespread use as a semipermeable membrane for commercial oxygen production. By reducing the costs of producing pure oxygen, the membranes of the present invention can greatly enhance several industries. Natural gas, comprising mostly methane, can be converted to clean burning transportation fuels, by using pure oxygen for conversion of methane to syngas. Commercial production of such fuels has been hindered by the high cost of oxygen production, which to date is primarily from expensive and energy-intensive cryogenic processing. An alternative is the use of dense ceramic membranes, based on mixed-conducting perovskite ceramic oxides that exhibit high ionic and electronic conductivity for oxygen. These types of membranes have become of great interest as a potentially economical, clean and efficient means of producing pure oxygen by separation from air or other oxygen-containing gas mixtures. Other applications of oxygen-separating membranes range from small-scale oxygen pumps for medical applications to large-scale usage in combustion processes, e.g. coal gasification. Another application of mixed-conducting oxide membranes is to be found in the field of chemical processing, including the partial oxidation of light hydrocarbons, such as natural gas to value-added products including ethane-ethene mixtures, syngas production, waste reduction and recovery.

The desired perovskite structure ($ABO_3$) consists of a cubic array of corner-sharing $BO_6$ octahedra, where B is a transition metal cation. The A-site ion, interstitial between the $BO_6$ octahedra, may be occupied by either an alkali, an alkaline earth, or a rare earth ion. In many cases, the $BO_6$ octahedra are distorted, tilted due to the presence of A ion, which is generally larger than the B cation. The onset of electronic conductivity mainly depends on the nature of the B-site cation. The total electrical conductivity can be either predominantly ionic as in the acceptor-doped rare earth aluminates or predominantly electronic, as in the late transition metal containing perovskites. Some perovskite oxides ($ABO_3$) containing a transition metal at B sites are found to be good mixed-conducting materials, exhibiting both ionic and electronic conductivities. Due to their high electronic and ionic conductivity, these materials can be used as oxygen semipermeable membranes without electrodes and external circuits. Oxygen conductive ceramic materials include yttria-stabilized zirconia doped with either titania and ceria. Conducted on acceptor-doped perovskite oxides include those with the generic formula $La_{1-x}A_xCo_{1-y}B_yO_{3-\delta}$, wherein A=Sr, Ba or Ca and B=Fe, Cu or Ni).

Another application of gas separation membranes is in the production of hydrogen. Generation of pure hydrogen is required for various large-scale industrial applications such as hydrodesulfurization and hydrotreating processes in refineries. The increase of hydrogen to carbon ratios in transportation fuels and the burgeoning field of hydrogen fuel cells are expected to greatly increase the demand for hydrogen gas. Hydrogen can be extracted from raw fuels such as natural gas as well as from process streams such as the catalytic gasification of coal, non-oxidative methane conversion and steam reforming. Membrane-based separation processes are cost-effective and environmentally friendly alternatives for separating hydrogen when compared with other more energy intensive processes such as distillation and pressure swing adsorption. To be useful in industrial processes these separation membranes must be stable at high temperatures (up to 1000° C.) and pressures (up to 600 psi). Industrial membranes must also have reasonably high tolerances to corrosion or poisoning by the effluent streams commonly encountered in industrial processes.

Ultrahigh purity hydrogen can be produced from gaseous mixtures containing hydrogen by the use of three types of membranes including polymeric membranes, inorganic (non-metal porous or nonporous) membranes and dense (metal) membranes. Polymeric membranes suffer from limited selectivity and resistance to high temperatures and reactive chemicals that may be present in typical feed streams. Porous inorganic membranes exhibit very high hydrogen permeability, but suffer from brittleness and very low hydrogen selectivity. Inorganic membranes derived from proton conducting solid-oxide ceramic materials exhibit lower permeability, are brittle, and require an electric current to be applied through electrodes at each surface of the membrane to induce the proton conduction. Examples of proton conducting membranes that do not require the application of electric fields include the perovskites such as yttria-stabilized strontium zirconate and yttria-stabilized strontium cerate.

Palladium and palladium alloy membranes have generated much interest in their applications to membrane reactors. Membrane reactors function as both separator and reactor in a single unit. These membranes are superior to polymeric membranes and to inorganic (non-metal) membranes in that they exhibit excellent selectivity for hydrogen and can be operated at high temperatures (up to 1000° C.). Palladium-based membranes are easily poisoned by sulfur containing gas contaminants such as hydrogen sulfide. To overcome the deficiencies associated with sulfur-deactivation, palladium metal is coated with a thin layer of yttria-stabilized strontium zirconate, which is not affected by sulfur containing compounds.

Another practical application of epitaxial thin films is as dielectric material in capacitors. Capacitors are used in almost every electronic product, as they are one of the key passive components in electronic circuits. They are utilized according to their capacitance values which are dependent on their physical structure and dielectric permittivity. The current invention utilizes the CCVD process to deposit low-loss, epitaxial perovskite films to produce dielectric layers with extremely high permittivity. This produces capacitors with a greater capacitance to size ratio, resulting in a reduction in the required size and weight of individual capacitors and the overall circuit. This advantage can be utilized in discrete components as well as embedded devices.

Once a capacitor is formed, its thickness and dimension are fixed and therefore, the only adjustable factor for modifying capacitance is its permittivity. The epitaxial dielectrics of the current invention, allow the application of a DC bias to adjust the capacitance of capacitors made of high-permittivity, low-loss ferroelectric materials. These electrically tunable capacitors can be used in a wide variety of applications. For example, a signal filter circuit, normally composed of a capacitor and a resistor, will be able to function as a multiple frequency filter by electrically adjusting the permittivity and hence, the capacitance. Capacitors embedded in printed circuit boards can also take advantages of this multiple frequency capability. In wireless communication, electrical adjustment of permittivity will induce phase shifts that are highly desired for phase array radar. In addition, these tunable devices can also be used as filters and oscillators for telecommunication at variable frequencies. Prior art capacitors are not able to achieve the desired properties using a practical material processing approach. Thin disks of dielectric materials, sliced from bulk materials, require a voltage in the order of 1000 V to achieve practical adjustability. In addition previously deposited dielectric films have been too glossy to render practical utilization of this effect.

Accordingly, it is a first object of the invention to provide thin film, epitaxial buffer layers for high temperature superconductors, that provide protection and insulation of the superconductor.

It is another object of the invention to provide dense and pore-free electrolytes for solid oxide fuel cells.

It is a further object of the invention to provide dense and pore-free membranes for separating oxygen or hydrogen from mixed gas streams.

It is yet another object of the invention to provide dielectric layers with high permittivity and low loss for use in capacitors.

It is still another object of the invention to provide electrically adjustable capacitors by using dielectric layers with high permittivity and low loss.

These and other objects of the present invention will become readily apparent upon further review of the following specification and drawings.

BRIEF DESCRIPTION OF THE DRAWINGS

The foregoing and other objects and advantages of the invention will be appreciated more fully from the following further description thereof, with reference to the accompanying drawings wherein.

DETAILED DESCRIPTION OF THE CERTAIN ILLUSTRATED EMBODIMENTS

The present invention may be understood more readily by reference to the following detailed description of certain embodiments of the invention and the Figures. While the epitaxial thin films of the present invention can be deposited using a number of suitable techniques, the preferred method of deposition is CCVD as described in the above-mentioned U.S. patents. Furthermore when a reducing atmosphere is required to avoid oxidation of the substrate or for other reasons, it may be desired to use a controlled atmosphere chemical vapor deposition (CACVD) technique. Other deposition techniques that provide a reducing atmosphere or a vacuum environment may also be used, however as is well documented in the CCVD patents, the numerous advantages of the CCVD and CACVD processes are understood to make them the preferred methods.

Figure 1:
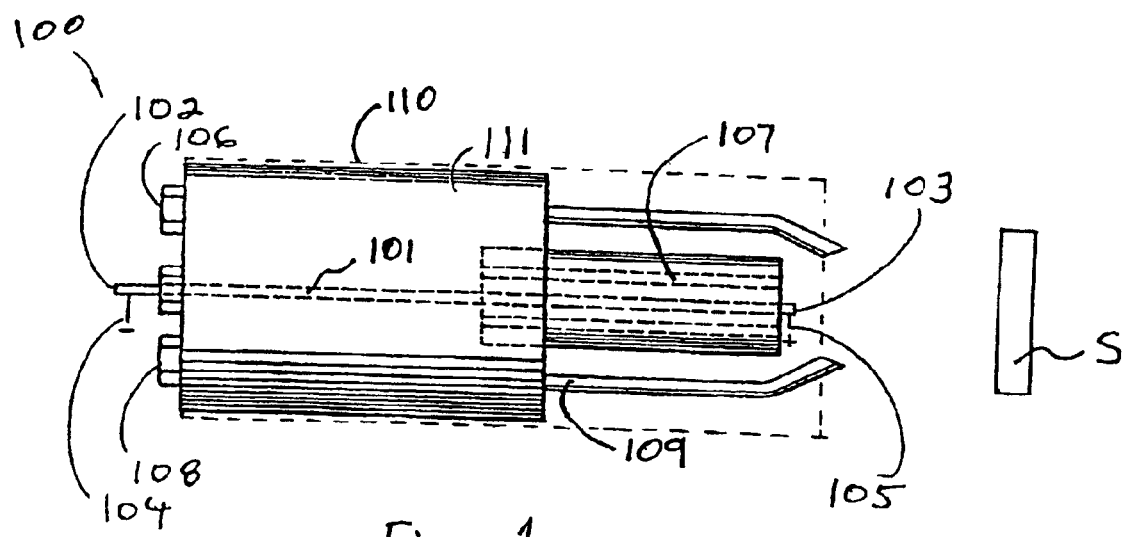
FIG. 1 is a side plane view of an apparatus used to deposit the epitaxial thin films of the present invention.
Figure 2:
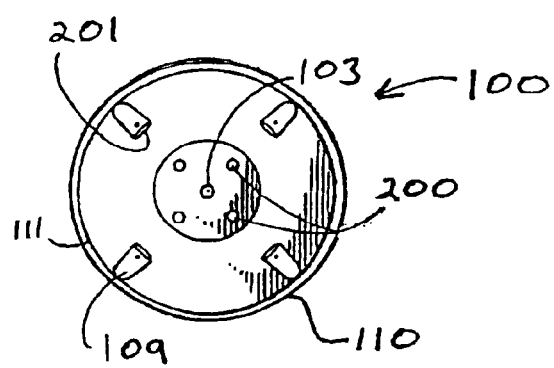
FIG. 2 is a front view of the apparatus of FIG. 1.

One deposition method for growing epitaxial thin films on nickel employs CACVD to avoid, or reduce, oxidation of the nickel during the deposition process. FIGS. 1 and 2 illustrate a CCVD and CACVD apparatus 100 that may be used to deposit the epitaxial thin films of the present invention, and reference to these figures should be made with respect to the examples described below. The needle 101 is supplied with the precursor at a supply end 102 and includes a delivery orifice 103 that can be swaged to form a restriction, or may be non-swaged. Electrodes 104 and 105 are attached to the ends of the needle 101 to provide a DC or AC current for heating the precursor in the needle when required. Tip oxygen is supplied to supply port 106 and is routed around the needle 101 through conduits 107 and out of orifices 200. The hydrogen pilot gas is supplied to supply port 108 and is routed around the tip oxygen through conduits 109 and out of delivery ports 201. The delivery orifice 103 and substrate S are located in a localized reducing atmosphere provided by the pilot gas hydrogen. To avoid oxidation of some coatings and/or substrates, a shield 110 may be attached to the body 111 of the apparatus, thereby allowing a controlled atmosphere depostion process. The shield gas is an inert gas such as argon, and is supplied through the shield 110 and around the pilot hydrogen. Should further oxidation protection be required, the entire apparatus 100 and substrate S may be placed in a chamber and additional argon may be supplied around the deposition area during deposition and while cooling the substrate after the deposition. It should be noted that apparatus 100 is only an example and other types of devices, including devices for other methods of deposition, may be used to produce the thin films described herein.

Methods for employing the apparatus 100 for forming films on a substrate include those described in the above referenced U.S. Pat. No. 5,997,956, issued to Hunt et al. As discussed therein chemical vapor deposition and powder formation may be achieved using thermal spray with fluid solutions including near supercritical and supercritical fluid solutions, to produce very fine atomization, nebulization, vaporization or gasification. The dissolved chemical precursors need not have high vapor pressure, but high vapor pressure precursors can work well or better than lower vapor pressure precursors. By heating the solution fluid just prior to or at the end of the nozzle or restriction tube, the available time for precursor chemical reaction or dissolution prior to atomization is understood to be minimized. This method can be used to deposit coatings from various metalorganics and inorganic precursors.

The above described type of device was employed to form epitaxial thin films suitable for use as buffer layers in applications including high temperature superconductors, electrolytes in solid oxide fuel cells (SOFC), gas separation membranes and dielectric material in electronic devices. By using CCVD, CACVD or any other suitable deposition process, epitaxial films having pore-free, or substantially pore-free, grain boundaries, and dense structure can be formed. Several different types of materials are disclosed for use as buffer layers in high temperature superconductors. For purposes of describing the epitaxial thin films of the invention, certain examples are provided below, however, it will be understood that the examples below are merely representative of the films of the invention, and are not to be deemed limiting, or an exhaustive list of such films.

EXAMPLE 1

In this example, $SrTiO_3$ (STO) was deposited on roll textured Ni. The precursor solution included 1.26 g of Sr-2-ethylhexanoate (2eh) (diluted with toluene to 1.5 wt % Sr), 1.11 g of Ti-di-I-propoxide bis acetylacetonate (diluted with isopropanol to 0.94 wt % Ti), 51 ml denatured ethanol and 300 g of propane. This solution was fed to the needle at a rate of 3 ml/min., while supplying 1.75 amps of heating current to the needle. Tip oxygen at 80 psi was supplied at a rate of 3 lpm, pilot hydrogen at 15 psi was supplied at a rate of 18 lpm and argon at 50 psi was used as the shield gas at a rate of 32 lpm. The deposition was conducted for 10 minutes with a substrate temperature of 950° C.

Figure 3:
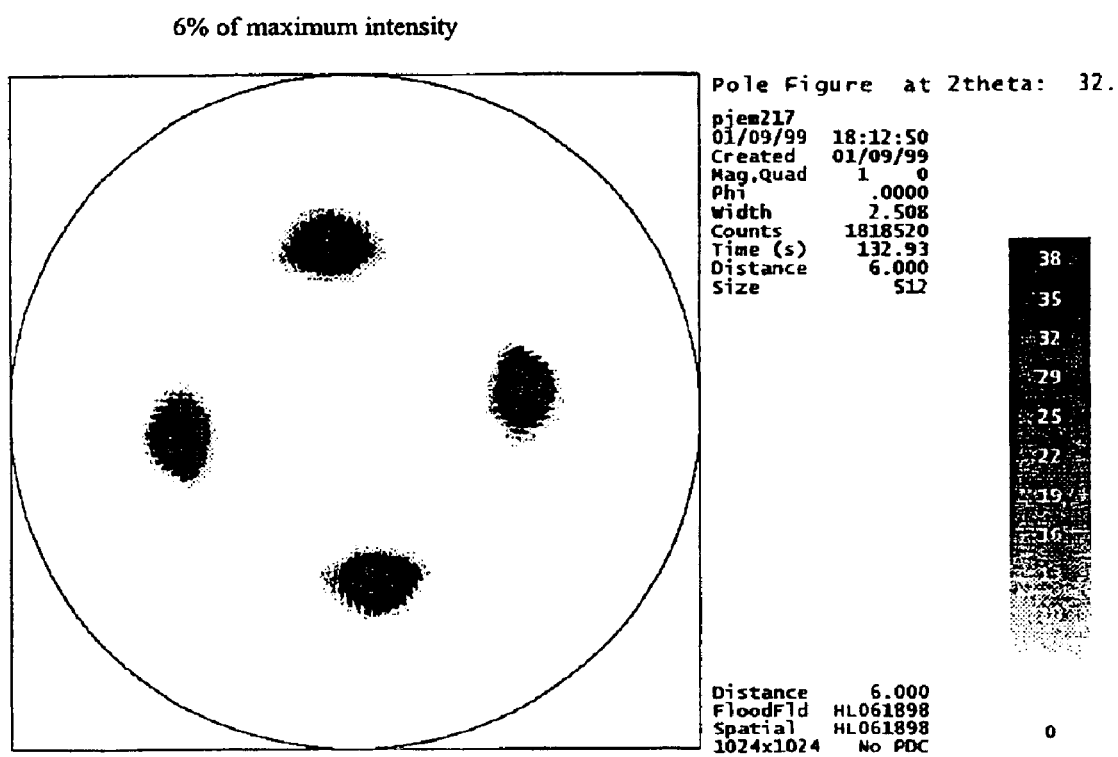
FIG. 3 is a pole figure showing the desired single orientation of SrTiO3 on textured Ni.

The deposited buffer layer was highly epitaxial and exhibited a single cube in-plane orientation as shown in FIG. 3.

Figure 4:
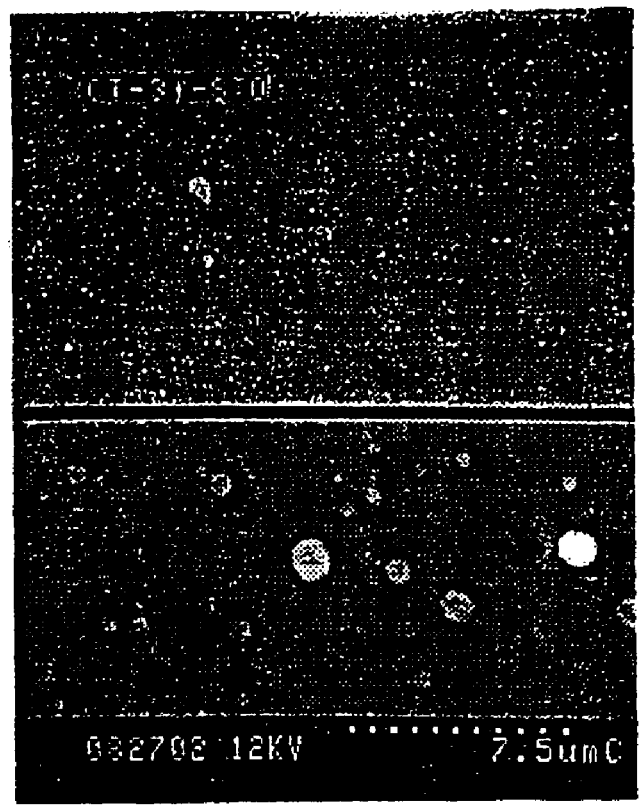
FIG. 4 is a typical nanostructure of SrTiO3 on textured Ni.

FIG. 3 is a pole figure of a YBa2Cu3Ox (YBCO) superconductor deposited on top of the CCVD deposited SrTiO3 buffer layer on Ni. The pole figure of the YBCO layer is exhibiting the same single in-plane orientation of the buffer layer which is necessary for the superconductor to exhibit high critical current densities. Typical in-plane measurements of the STO were determined to be 8.89° full-width-at-half-maximum (FWHM) for the (111) plane. Typical out-of-plane measurements were 7.53° FWHM for the (002) plane. FIG. 4 is a typical microstructure of $SrTiO_3$ on Ni. The film is dense and continuous which allows the film to act as a template for a superconductor that exhibits a high critical current density. For use in superconductor applications, the thickness of the perovskite buffer layer should be between 50–1000 nm. Initial Auger experiments show that these thicknesses prevent significant diffusion of the metal substrate and any oxide that may form. A YBCO film was successfully deposited onto a CCVD deposited $SrTiO_3$ film on Ni. While the length of the coated specimen is approximately 2 cm, this length can be increased to useful parameters using a reel-to-reel system.

Figure 6:
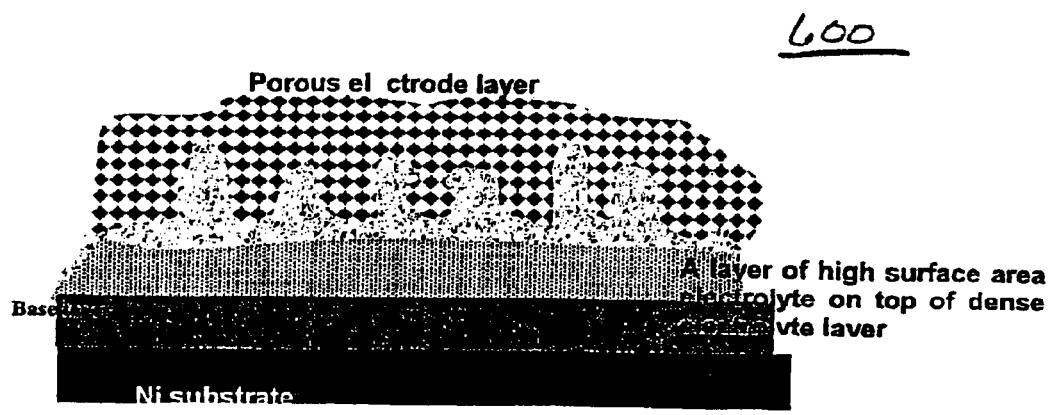
FIG. 6 depicts pictorially one fuel cell having an epitaxial layer according to the invention.
Figure 7:
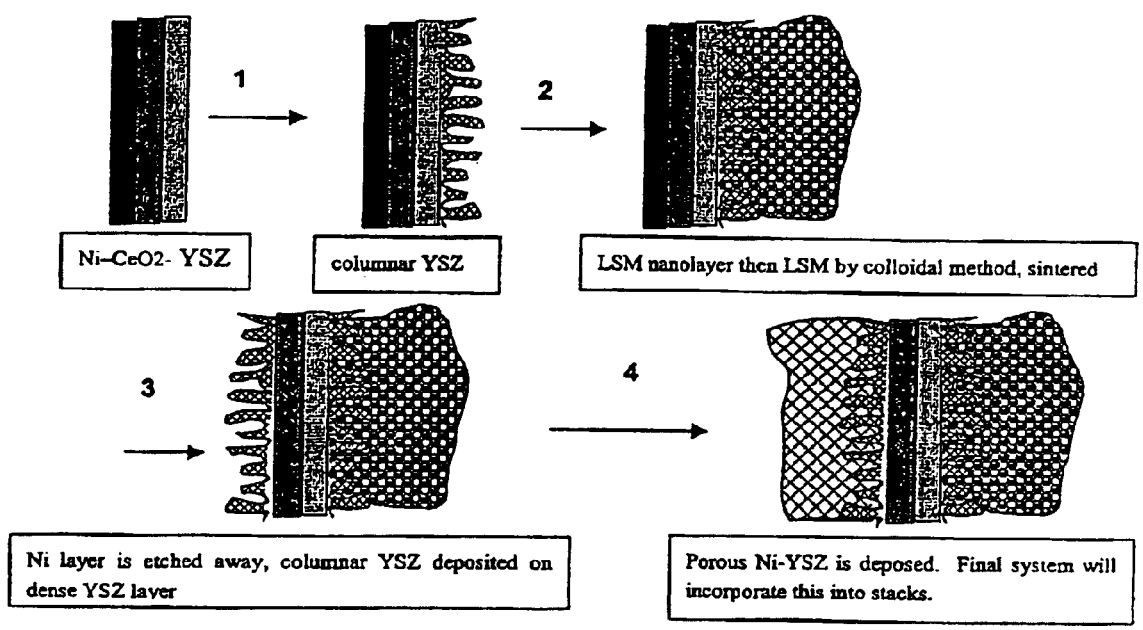
FIG. 7 depicts pictorially one process for forming the fuel cell of FIG. 6.

In the formation of fuel cells, such as the Fuel Cell 600 depicted in FIG. 6, single crystal or epitaxial YSZ is deposited using CCVD or CACVD on a roll textured single crystal Ni substrate to form a YSZ electrolyte. On top of the electrolyte layer, a cathode such as LaSrMnO (LSM) is deposited. The cathode can be deposited completely by CCVD or CACVD, or an interface layer from 50–200 nm can be deposited using the CCVD or CACVD process and other deposition processes such as sol-gel can be used to deposit the bulk of the cathode. After deposition of the cathode, the Ni can be etched off of the electrolyte, as the cathode will provide the necessary support layer. The anode is then deposited on the electrolyte to complete the fuel cell. FIG. 7 depicts one process for forming such a fuel cell.

It is important to note that several different variations of the above method can be used to form the fuel cell. Additionally, other electrolytes may be used such as $BaCeO_3$, and any single crystal substrate can be used. Any suitable electrode materials may be used as well. The epitaxial and near single crystal electrolyte provides increased performance over polycrystalline electrolytes by minimizing grain boundary effects. The etching step can be avoided by directly depositing the electrolyte to an electrode. For example, NiO and YSZ powders can be pressed into pellets and sintered to yield dense discs for the anode. The electrolyte is then directly deposited onto these dense discs using CCVD or CACVD. Heat treatment of the coated discs in a reducing atmosphere reduces the NiO to Ni and creates porosity in the anode. Cathode (e.g. Ag) paste is then applied to the electrolyte by screen printing or brushing and heat treatment is used to remove the organic portion of the paste leaving a porous metal layer for the cathode. The anode discs can be dip coated with additional anode material prior to CCVD coating of the electrolyte.

Fuel cells will be constructed with electrolyte thin film and porous electrodes on each side of the electrolyte layer. The process may involve not only the CCVD technique but also other coating/forming methods. In general, the electrolyte material, for example YSZ, will be deposited onto a smooth lattice-compatible, large-grained (>1cm) substrate. A dense, porelgrain-boundary free, epitaxial YSZ film of one-five micron neighborhood is then deposited. Consequently, the cathode, for example LSM, will be applied onto the YSZ layer via CCVD or by screen printing etc. The substrate will then be removed by etching or simply melting away depending on the property of the substrate.

Finally, the anode, perhaps Ni-YSZ, is formed on the exposed YSZ surface by the CCVD process or by depositing porous YSZ via the CCVD technique and filtrating with Ni (or NiO) slurry. Steps in this process development may also involve the use of bi-layer electrolyte (ceria/YSZ), or creating a rougher microstructure of YSZ on top of the dense YSZ layer. Porous LSM layer can be deposited first by growing a thin LSM layer (in nanometer range) on YSZ via CCVD and then build up the thickness by other coating method, in order to further reduce interface resistance. A strong LSM layer is typically employed because after the removal of the substrate it acts as a supporting layer during the processing. After the removal of the substrate, porous Ni-YSZ layer of 10–30 µm thickness will be deposited onto the exposed surface. This anode layer will be thin to maximize efficiency and minimize the polarization.

It is generally recognized that increasing the TPB (three-phase-boundary between the gas, electrode and electrolyte) line length should increase the reaction rate in fuel cells. One can increase the TPB line length by using a porous composite electrode (cermet e.g. Ni-YSZ, Ru-YSZ). The electrode is required to be porous and electronically conductive in order to facilitate the transport of gaseous species or ions to the electrolyte while allowing for the collection of electrons from the associated electrochemical reactions at the interface. It is also preferred because the contiguous electrode layer has fine pore sizes.

The use of CCVD to increase conductivity by reducing film thickness and using highly epitaxial and single crystalline thin films as the electrolyte in SOFCs has been accomplished. To test the feasibility of producing these single crystal electrolytes, YSZ films of 480 and 410 nm thickness were deposited onto sapphire substrates via CCVD at 1050° C. The YSZ films were deposited onto sapphire substrates at a deposition rate as high as 10.8 µm/hr at a 1400° C. flame temperature and at 2.5 µm/hour at a 1150° C. deposition temperature. At these flame temperatures, the substrate temperature is about 900–1100° C. and below 800° C., respectively. The samples were tested for impedance spectroscopy. Fully stabilized zirconia with 8 mole percent (m/o) yttria (8YSZ) may be used as the main electrolyte material for deposition studies and process development. It is the most common electrolyte in SOFCs for its adequate level of oxygen-ion conductivity and its stability in both oxidizing and reducing environments. The use of fully stabilized phase is preferred to yield maximum conductivity and avoid the problems of phase transformation associated with partially stabilized zirconia.

Figure 5:
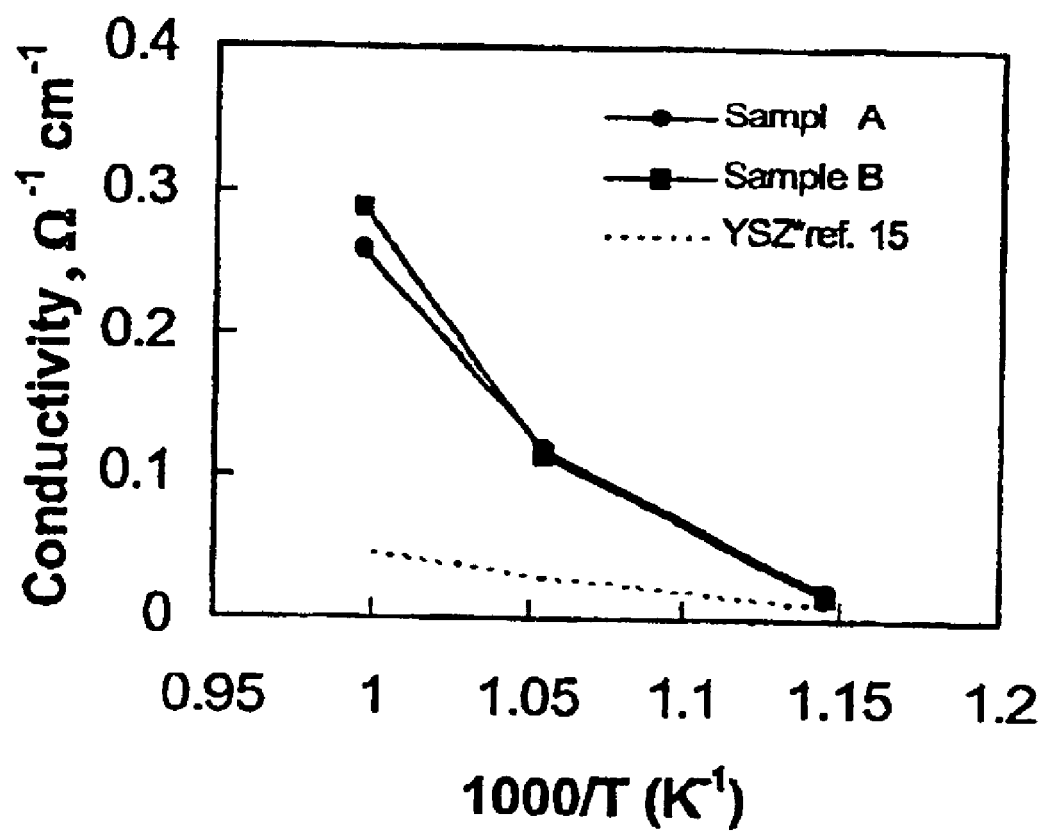
FIG. 5 is a plot of the conductivity vs. temperature for two samples A, B, and YSZ from a reference.

After the electrodes consisting of Heraeus C-1000 silver paste and silver lead wires were fired onto the samples at 800° C. for 10 minutes, these two samples were placed in a furnace with lead wires coming outside for applying a test signal. The frequency was swept from $2 \times 10^7$ Hz to 0.1 Hz while acquiring the impedance spectra at 600, 675 and 730° C. The resistance associated with the YSZ films was then converted to conductivity, and normalized for a standard geometry. The calculated conductivity values are illustrated in FIG. 5 along with the data from Reference 15. The figure is a Plot of the Conductivity (in $\Omega^{-1} cm^{-1}$) vs. Temperature (1000/T, $K^{-1}$) for Samples A, B, and YSZ from Reference 15. The resulting high conductivity for CCVD deposited YSZ films can be explained by the high degree of epitaxy and the absence of grain boundary in the film. A high degree of epitaxy and the absence of grain boundary greatly reduce the interface and boundary resistance, and, hence, increase the conductivity. Sources of deviation, which are minor, are the conduction across the surface of the YSZ film instead of through the film, which should be minor since sapphire is not conductive, and the inaccurate measurement of the sample geometry. One should note that the configuration used here for testing can yield data on the YSZ film but the conductivity data is not directly applicable to fuel cell application due to the substrate. After examination by SEM, the films appeared to be dense and uniform with no observable grain boundary or pores. The XRD pattern of the YSZ films on sapphire showed a preferred orientation of (111). An XRD pole figure pattern of the (11) peak was acquired for a YSZ film deposited onto a-axis sapphire via CCVD. The intensities are less than one, which is less than 0.5% of the maximum, except at the four 45 degree φ locations (90° to each other), and a very minor peak at the origin of the pole figure. This pole figure indicates the high degree of epitaxy in the YSZ film.

Oxide electrolyte materials including yttria-stabilized zirconia (8 m/o yttria, 8YSZ), ceria ($CeO_2$), yttria-doped ceria (YDC), yttria-stabilized bismuth oxide (YSB) and samaria-doped ceria (SDC), have been deposited on substrates using CCVD processing. Strontium doped lanthanum manganite (LSM), a commonly used cathode, has also been deposited by the CCVD technique. Deposition parameters were adjusted to achieve porous, columnar structure for LSM films. Yttria-stabilized zirconia -based solid oxide fuel cells were constructed using NI-YSZ cermet as the anode, YSZ as the electrolyte and silver as the cathode. Ceria films were deposited on both fused silica and sapphire substrates. Highly crystalline films of cerianite phase were produced at as low as 700° C. flame temperature. The XRD patterns indicated a (200) preferred orientation and the degree of epitaxy increased as the deposition temperature increased. YDC, YSB and SDC thin films were also deposited onto sapphire substrates to exploit the feasibility of the CCVD process in producing ceria- and bismuth-based electrolytes for SOFCs. Highly crystalline and dense films were produced using CCVD. By adjusting the precursor solution concentration, deposition temperature, and atomization settings, adherent and columnar LSM cathode layers were deposited on sapphire substrates. The film thickness of the deposited layers included layers of approximately 420 nm. SEM micrographs of YSZ thin films deposited by the CCVD processing at 1350° C. showed dense films with no grain boundary, however white spheres indicative of foreign particles provided for contrast were identified. The films had an undulating structure achieved by changing degree of atomization, and a columnar structure was also achieved. Additionally, YSZ (111) XRD pole figures indicated strong epitaxy on a-plane sapphire; and $CeO_2$ (111) XRD pole figures indicated strong epitaxy on lanthanum aluminate (100).

Figure 8:
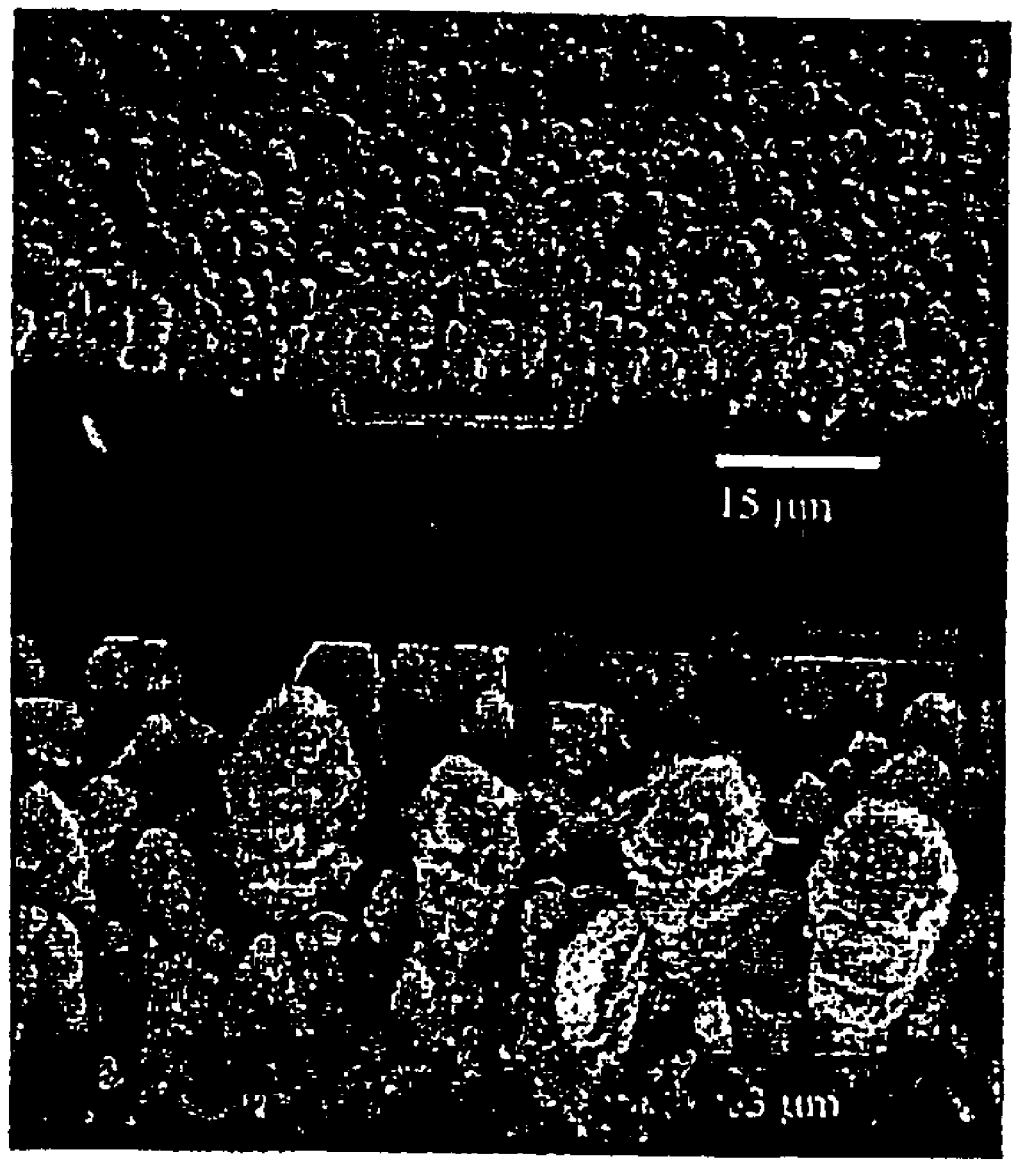
FIG. 8 depicts an SEM micrograph of LSM on sapphire showing a porous and columnar microstructure.

The main candidate electrode materials will be Ni-YSZ and La doped strontium manganate (LSM). The materials will be either deposited onto electrolyte layer via CCVD or in combination with other methods. An example of porous LSM is shown in FIG. 8. Another example for combining coating techniques could involve an initial deposition of a porous layer of electrolyte material over the dense electrolyte using the CCVD process. After depositing the porous layer, the next step is to infiltrate the electrode material into the pores to form a contiguous porous electrode while maintaining a long TPB line length.

EXAMPLE 2

In this example, LSM was deposited on a-plane sapphire using CCVD. The precursor solution comprised 0.21 g Mn-2eh (diluted with mineral spirits to wt % 6 wt % Mn), 1.96 g La-2eh (diluted with mineral spirits to 2 wt % La), 0.97 g Sr-2eh (10 wt % Sr in 2-ethylhexanoic acid and further diluted with toluene to 1.25 wt % Sr). This solution was added to toluene for a total volume of 10 ml, and then added to 60 g propane. This solution was fed at a rate of 3 ml/mn. for a total deposition time of 30 min. 2.42 amps of current were supplied to the needle with 3500 ml/min. of tip oxygen. Tip oxygen was 60 psi (with no hydrogen or argon). The flame temperature was maintained at 1200–1400 degrees C. In FIG. 8, the SEM micrograph of LSM on sapphire shows a porous and columnar microstructure. The porosity of the electrode layer must be sufficient for the transport of gaseous species or ions to the electrolyte while allowing for the collection of electrons from the associated electrochemical reactions at the interface.

EXAMPLE 3

In this example, YSB was deposited on a-plane sapphire using CCVD. The precursor solution comprised 2.88 g Ba-2eh (8.5 wt % Ba in xylene and further diluted with toluene to 2 wt % Ba), 0.08 g Y-2eh (diluted with toluene to 0.69 wt % Y). This solution was added to toluene for a total volume of 10 ml, and then added to 60 g propane. This solution was fed at a rate of 3 ml/min. for a total deposition time of 29 min. 2.50 amps of current were supplied to the needle with 3300 ml/min. of tip oxygen. The flame temperature was maintained at 1200 degrees C. Tip oxygen was 60 psi (with no hydrogen or argon).

EXAMPLE 4

In this example, YDC was deposited on a-plane sapphire using CCVD. The precursor solution comprised 1.17 g Ce-2eh (12 wt % Ce in 2-ethylhexanoic acid and further diluted with toluene to 1.8 wt % Ce), 0.22 g Y-2eh (diluted with toluene to 0.69 wt % Y). This solution was added to toluene for a total volume of 14 ml, and then added to 51 g propane. This solution was fed at a rate of 3 ml/min. for a total deposition time of 21 min. 2.76 amps of current were supplied to the needle with 3500 ml/min. of tip oxygen. The flame temperature was maintained at 1350 degrees C. Tip oxygen was 60 psi (with no hydrogen or argon).

In the field of gas separation membranes, specifically for hydrogen selective membranes, hydrogen conducting pervoskite ceramic oxide coatings such as $SrZrO_3$ and $SrCeO_3$ are deposited onto palladium. These films are dense, homogeneous, pinhole free and sub-micron thick. Hydrogen transport rates through these composite membranes at 300° C. are approximately 70 SC GPU's.

EXAMPLE 5

In this example, SrZrO3 was deposited on Pd using CCVD. The precursor solution comprised 2.19 g Sr-2eh (10 wt % Sr in 2-ethylhexanoic acid and further diluted with toluene to 1.5 wt % Sr), 0.912 g Zr-2eh (diluted with mineral spirits to 6 wt % Zr), 0.24 g Y-2eh (diluted with toluene to 0.7 wt % Y). This solution was added to 160 ml ISP, and then added to 75 g propane. This solution was fed at a rate of 3.13 ml/min. for a total deposition time of 38 min. 3.0 amps of current were supplied to the needle with 5930 ml/min. of tip oxygen (80 psi) and 1200 ml/min. of pilot hydrogen. The flame temperature was maintained at 1150 degrees C.

Epitaxial dielectrics for capacitors can be formed from a wide range of dielectric materials. Using the CCVD process, single phase, epitaxial (determined from XRD) $SrTiO_3$, $Ba_{0.5}Sr_{0.5}TiO_3$, and $Ba_{0.6}Sr_{0.4}TiO_3$ films were successfully coated on (100) MgO single crystal substrates. Examples are described below.

EXAMPLE 6

In this example, $SrTiO_3$ coatings were deposited onto MgO using the CCVD process. The solution of the $SrTiO_3$ precursor contained 0.0452 wt % of Sr in the form of strontium 2-ethylhexanoate, 0.0449 wt % Ti (di-i-propoxide) bis (acetylacetonate), 13.3329 wt % toluene, 0.5828 wt % isoproponal, and 85.9919 wt % propane. The constant flow rate for the solution was at 2.0 ml/min and for the tip oxygen 4000 ml/min at 80 psi. The deposition temperature as measured at the substrate front surface varied from 900 to 1100° C.

EXAMPLE 7

In this example, $Ba_{0.5}Sr_{0.5}TiO_3$ coatings were deposited onto MgO using the CCVD process. The solution of the $Ba_{0.5}Sr_{0.5}TiO_3$ precursor contained 0.0146 wt % of Sr in the form of strontium 2-ethylhexanoate, 0.0420 wt % of Ba in the form of barium 2-ethylhexanoate, 0.0311 wt % Ti (di-i-propoxide) bis (acetylacetonate), 13.3774 wt % toluene, 0.0104 wt % isoproponal, 0.5023 wt % 1-butanol, and 86.0404 wt % propane. The constant flow rate for the solution was at 2.0 ml/min and for the tip oxygen 4000 ml/min at 80 psi. The deposition temperature as measured at the substrate front surface varied from 900 to 1100° C.

EXAMPLE 8

In this example, $Ba_{0.6}Sr_{0.4}TiO_3$ coatings were deposited onto MgO using the CCVD process. The solution of the $Ba_{0.6}Sr_{0.4}TiO_3$ precursor contained 0.0143 wt % of Sr in the form of strontium 2-ethylhexanoate, 0.0615 wt % of Ba in the form of barium 2-ethylhexanoate, 0.0355 wt % Ti (di-i-propoxide) bis (acetylacetonate), 12.6049 wt % toluene, 0.0118 wt % isoproponal, 1.5333 wt % 1-butanol, and 85.7412 wt % propane. The constant flow rate for the solution was at 2.0 ml/min and for the tip oxygen 4000 ml/min at 80 psi. The temperature as measured at the substrate front surface varied from 900 to 1100° C.

It is to be understood that the terminology used herein is for the purpose of describing particular embodiments only and is not intended to be limiting. It must be noted that, as used in the specification and the appended claims, the singular form is "a," "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

It should be apparent to those skilled in the art that various modifications or variations could be made to the present invention without departing from the scope of the invention. Other embodiments of the invention would be apparent to those skilled in the art from review of the specification disclosed herein. It is intended that the specification be considered as exemplary only, with the true scope of the invention being indicated by the following claims.

What is claimed is:

1. A method of making a dielectric layer between a pair of opposing electrodes comprising the steps of: forming, as said dielectric layer, an epitaxial thin film on a textured substrate; forming one of said electrodes on an exposed surface of said thin film; wholly or partially removing said textured substrate; and forming an electrical connection to access said dielectric layer on the side of said textured substrate.

2. The method according to claim 1 wherein the textured substrate comprises nickel.

3. The method according to claim 1 wherein said epitaxial thin film is formed from perovskite.

* * * * *